(12) United States Patent  
Petrov et al.

(10) Patent No.: US 7,112,803 B2
(45) Date of Patent: Sep. 26, 2006

(54) BEAM DIRECTING SYSTEM AND METHOD FOR USE IN A CHARGED PARTICLE BEAM COLUMN

(75) Inventors: Igor Petrov, Holon (IL); Igor Krivts (Krayvitz), Rehovot (IL); Albert Karabekov, Ashdod (IL)

(73) Assignee: Applied Materials, Israel, Ltd., Rehovot (IL)

( * ) Notice: Subject to any disclaimer, the term of this patent is extended or adjusted under 35 U.S.C. 154(b) by 4 days.

(21) Appl. No.: 10/897,635

(22) Filed: Jul. 23, 2004

(65) Prior Publication Data

US 2006/0016988 A1 Jan. 26, 2006

(51) Int. Cl.
*H01J 37/10* (2006.01)
*H01J 37/147* (2006.01)

(52) U.S. Cl. .................. 250/396 R; 250/310; 250/311; 250/396 ML (58) Field of Classification Search ................ 250/306, 250/307, 309–311, 369 R, 396 ML, 397–399, 250/492.1–3, 440.11, 441.11
See application file for complete search history.

(56) References Cited

U.S. PATENT DOCUMENTS

| | | | | |
|---|---|---|---|---|
| 3,922,546 A | * | 11/1975 | Livesay | 250/310 |
| 4,401,539 A | * | 8/1983 | Abe et al. | 204/192.13 |
| 4,434,371 A | * | 2/1984 | Knauer | 250/396 R |
| 4,596,928 A | * | 6/1986 | Dantilatos | 250/307 |
| 4,720,633 A | * | 1/1988 | Nelson | 250/310 |
| 4,784,739 A | * | 11/1988 | Kadokura et al. | 204/192.2 |
| 4,810,889 A | * | 3/1989 | Yokomatsu et al. | 250/492.2 |
| 4,831,266 A | * | 5/1989 | Frosien et al. | 250/397 |
| 4,882,487 A | * | 11/1989 | Gerlach | 250/306 |
| 4,889,995 A | * | 12/1989 | Tsutsumi et al. | 250/440.11 |
| 5,017,789 A | * | 5/1991 | Young et al. | 250/396 ML |
| 5,229,607 A | * | 7/1993 | Matsui et al. | 250/306 |
| 5,362,964 A | * | 11/1994 | Knowles et al. | 250/310 |
| 5,412,211 A | * | 5/1995 | Knowles | 250/310 |
| 5,780,859 A | * | 7/1998 | Feuerbaum et al. | 250/396 R |
| 5,831,270 A | * | 11/1998 | Nakasuji | 250/396 ML |
| 5,869,833 A | * | 2/1999 | Richardson et al. | 250/310 |
| 6,084,238 A | * | 7/2000 | Todokoro et al. | 250/310 |
| 6,182,605 B1 | | 2/2001 | Frosien | |
| 6,194,729 B1 | * | 2/2001 | Weimer | 250/396 ML |
| 6,396,064 B1 | * | 5/2002 | Danilatos | 250/441.11 |
| 6,410,923 B1 | * | 6/2002 | Crewe | 250/396 ML |

(Continued)

FOREIGN PATENT DOCUMENTS

EP 1 045 425 10/2000

(Continued)

OTHER PUBLICATIONS http://www.occupationalinfo.org/72/721484014.html, "Field-Rising Assembler".*

(Continued)

*Primary Examiner*—Nikita Wells
*Assistant Examiner*—Bernard E. Souw
(74) *Attorney, Agent, or Firm*—Tarek N. Fahmi (57) ABSTRACT

A method and system are presented for directing a charged particle beam towards and away from a sample. The system comprises a lens arrangement having an electrode formed with a beam opening for a charged particle beam passage therethrough; and a magnetic deflector. The magnetic deflector has a magnetic circuit formed by a core part for carrying excitation coils and a polepieces part. The polepieces of the magnetic deflector are in electrical communication with the electrode of the lens arrangement and are electrically insulated from the other part of the magnetic circuit.

28 Claims, 7 Drawing Sheets

U.S. PATENT DOCUMENTS

| | | |
|---|---|---|
| 6,555,815 B1 * | 4/2003 | Feuerbaum et al. ........ 250/310 |
| 6,590,210 B1 * | 7/2003 | Essers ....................... 250/310 |
| 2004/0056207 A1 | 3/2004 | Petrov et al. |
| 2004/0173747 A1 * | 9/2004 | Dean et al. ................. 250/310 |

FOREIGN PATENT DOCUMENTS

| WO | WO 01/45136 | 6/2001 |
|---|---|---|
| WO | WO 01/56056 | 8/2001 |

OTHER PUBLICATIONS http://www.hnsa.org/doc/fleetsub/elect/chap2.htm, "Main Generators and Motors and Auxiliary Generator".*

* cited by examiner

BEAM DIRECTING SYSTEM AND METHOD FOR USE IN A CHARGED PARTICLE BEAM COLUMN

FIELD OF THE INVENTION

The present invention is generally in the field of inspection/measurement techniques of the kind utilizing irradiation of a sample by a focused beam of electrically charged particles, such as electrons, positrons, or ions, and relates to a beam directing system for use in a charged particle beam column.

BACKGROUND OF THE INVENTION

Charged particle beam columns are typically employed in scanning electron microscopy (SEM), which is a known technique widely used in the manufacture of semiconductor wafers, being utilized in a CD metrology tool, the so-called CD-SEM (critical dimension scanning electron microscope), and a defect review SEM (DF-SEM). In SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

SEM includes such main constructional parts as an electron beam source (formed with a small tip called "electron gun"), an electron beam column, and a detector unit. The detector unit may be located outside the path of the primary beam propagation through the column, or may be located in the path of the primary beam (the so-called "in-column" or "in-lens" detector). The electron beam column includes, inter alia, a beam focusing/deflecting arrangement formed by a lens assembly and a deflector assembly. The deflection of the primary beam provides for scanning the beam within a scan area on the sample, and also for adjusting incidence of the primary beam onto the sample (an angle of incidence and/or beam shift), as well as directing the secondary beam to the detector.

In SEM, in order to reduce the "spot" size of the electron beam (up to nanometers) and thus increase the image resolution, a highly accelerated electron beam is typically produced using accelerating voltages of several tens of kilovolts and more. Specifically, the electron optic elements are more effective (i.e. produce smaller aberrations) when the electrons are accelerated to high kinetic energy. However, in order to avoid damaging a sample (resist structure and integrated circuit) that might be caused by such a highly energized electron beam, the electron beam is decelerated just prior to impinging onto the sample. Deceleration of the electrons can generally be accomplished by selectively creating a potential difference between the polepiece of a magnetic objective lens and the sample. Alternatively, the same effect can be achieved by actually introducing electrodes having selective potential applied thereto.

Some systems of the kind specified utilize the lens assembly in the form of a combination of a magnetic objective lens and an electrostatic lens, the so-called "compound magnetic-electrostatic lens" (e.g., EP 1238405 and EP 1045425, both assigned to the assignee of the present application). The electrostatic part of the compound magnetic-electrostatic lens is an electrostatic retarding lens (with respect to the primary charged particle beam), and has electrodes held at different potentials, one of the two electrodes being formed by an anode (which is typically in the form of a tube defining a primary beam drift space for the primary beam propagation to the sample) arranged within a magnetic objective lens along its optical axis, and the other electrode being a metallic cup provided below the magnetic objective lens. The sample actually presents the third electrode of the electrostatic lens. The electric field created by the electrostatic lens in the vicinity of the sample appropriately decelerates the primary beam and also facilitates the extraction of secondary charged particles from the sample.

Another known problem of the inspection systems of the kind specified is associated with locating defects (foreign particles) on patterned surfaces. The pattern is typically in the form of a plurality of spaced-apart grooves. To detect the existence of a foreign particle located inside a narrow groove, it is desirable to tilt the scanning beam with respect to the surface, which tilting should be applied to selective locations on the specimen. A tilt mechanism may be achieved by mechanically tilting the sample holder relative to the charged particle beam column, and/or by electronically tilting the primary beam propagation axis. The electronic tilt is implemented by the deflector assembly, which may include one or more deflectors. This may for example be a magnetic deflector integrated into a magnetic objective lens (WO 01/56056), which has an excitation coil and upper and lower polepieces.

U.S. 20040056207, assigned to the assignee of the present application discloses a deflection system including a magnetic deflector (core and polepieces electrically connected to the core) and a polepiece assembly, which has a portion made of a soft magnetic material and is formed with an opening for a charged particle beam passage therethrough. The polepiece assembly is accommodated so as to be at least partly located within the magnetic field of the magnetic deflector to thereby conduct at least a portion of the magnetic field created by the deflector through the polepiece assembly towards the opening. This arrangement increases the effectiveness of deflection and facilitates operation with the tilt mode, by increasing a magnetic field for a given electric current through the excitation coils of the deflector. This allows for obtaining a desirably high deflecting magnetic field within the closest vicinity of the sample at the optical axis of the lens arrangement, without increasing a working distance, also in cases where the compound magnetic-electrostatic lens is used.

Generally, the image resolution of a charged particle beam column can be improved by increasing the anode voltage. However, this might result in a breakdown in the system operation. On the other hand, an increase of a negative voltage (in absolute value) applied to a sample under inspection when operating with a charged particle beam column in which the polepieces of a magnetic deflector are grounded, which is typically the case, is also limited by the breakdown condition at a given working distance. The term "working distance" is typically referred to as a distance between the electrode of the lens arrangement closest to the sample's plane (cap-electrode in the present case) and the sample's plane. This distance should be as small as possible, and the minimal possible working distance is typically defined by an arcing problem.

Yet another characteristic of the charged particle beam column is associated with a need for injection of gas into a vacuum chamber of the column. Generally, a need for the gas supply is associated with the following. Preciseness of measurements, such as CD measurements on semiconductor wafers and especially on lithographic masks (reticles), typically suffers from an effect of charging of the sample's surface by a scanning beam of charged particles, which causes an image drift. The gas supply into the vicinity of the sample and ionization by the scanning beam allow for reducing negative charging of the sample's surface sue to the precipitation of positive ions onto the sample's surface, and thus allow for increasing the precision of CD measurements.

The gas supply unit typically used in a DR-SEM includes a special nozzle tube for feeding the gas. The nozzle is mounted on the side surface of a conical objective lens such that the outlet opening of the nozzle is located proximate of the beam opening of the objective lens. This configuration is, however, unsuitable for a CD-SEM that typically utilizes a substantially flat cap-electrode and requires a smaller working distance (about 0.8 mm, instead of 1.5 mm used in DR-SEM). The conventional configuration of a gas supply unit used in the CD-SEM suffers from that disabling the cap electrode breaks the tightness connection between the electrode and the gas supply unit, because a gas tube thereof is connected to a holder separate from the cap electrode. Moreover, the connection zone is too small and therefore cannot be sufficiently reliable. Also, this configuration does not allow for using the so-called post-tilt deflector aimed at providing an on-axis tilt of a primary beam.

An example of the conventional gas supply system is described in U.S. Pat. No. 6,182,605. An apparatus for particle beam induced modification of a specimen includes a source for generating a particle beam, nozzles for supplying a gas in the region of the specimen, and electrodes which can be supplied with a variable voltage. These electrodes are forming a tube and the nozzles, being integrated in the electrodes, are leading into the tube.

U.S. Pat. No. 6,555,815, assigned to the assignee of the present application, discloses a charged particle beam column, where charging of the specimen is avoided or reduced by injecting inert gas onto the sample's surface. In order to avoid interactions with the electron optics, various embodiments are disclosed for providing a rotationally symmetrical nozzles and/or electrodes. Additionally, embodiments are disclosed wherein a plurality of gas conduits are arranged in a rotationally symmetrical manner. Alternatively, the conduit is incorporated into an element of the electron optics, such as the magnetic lens. Also, in order to reduce or eliminate interaction of the electrons with the gas molecules, embodiments are disclosed wherein the gas is pulsated, rather than continually injected.

SUMMARY OF THE INVENTION

There is a need in the art to facilitate measurement of a sample by a charged particle beam, by providing a novel beam directing system. It should be understood that the term "measurement" used herein actually signifies any monitoring of a sample (e.g., inspection), by imaging the sample with a charged particle beam.

The present invention is useful with the focusing/deflecting system utilizing a combination of a magnetic objective lens and an electrostatic lens ("compound magnetic-electrostatic lens"), and a magnetic deflector assembly. The magnetic objective lens is formed by at least two polepieces defining a magnetic lens gap therebetween. The electrostatic lens is formed by the first electrode defined by the lower end of an anode tube and the second electrode (called "cap-electrode") located between the anode and the sample. The second electrode serves for regulating an electric field created within the vicinity of the sample. The sample's surface serves as the third electrode of the electrostatic lens.

One aspect of the present invention is associated with the following: In the conventionally used column with the "compound magnetic-electrostatic lens", the voltage distribution is typically as follows: the sample is grounded ($V_s=0$), column voltage $V_{col}$ (voltage of the anode tube) is 8 kV, cap voltage $V_{cap}$ is about 3 kV when operating with a high-gradient electric field or fast electrons in the vicinity of the sample (High Angle Ratio or HAR mode), or ranges between 0 and −300V for low-gradient field (non-HAR mode). With this conventional voltage distribution, when operating with a normal mode the image resolution is limited by chromatic aberrations of the objective lens, and when operating at a tilt mode (especially large tilt mode) the resolution is limited by coma aberration; the CD precision measurement is limited by an insufficiently small spot size; the signal from detector (scintillator) especially at very low primary beam energy (lower than 200 eV) is limited by insufficient detector efficiency.

The term "primary beam" or "primary charged particle beam" signifies a charged particle beam, which is formed by charged particles generated by a source (cathode), and which is to be directed to a sample to knock out charged particles forming a "secondary beam" (also referred to as "secondary charged particle beam"), which is to be detected. The term "normal mode" signifies the primary beam incidence onto the sample with substantially zero incident angle, i.e., substantially perpendicular to the sample's surface. The term "tilt mode" signifies the primary beam incidence onto the sample along an axis forming a certain non-zero angle with the sample's surface.

As indicated above, the image resolution can generally be improved by increasing the anode voltage. However, this might result in a breakdown in the system operation.

According to the previous technique developed by the inventors of the present application and disclosed in a co-pending US application, the image resolution is improved by increasing an effective voltage of a charged particle beam column, namely, a voltage defined by the voltages on the anode and the sample (absolute value of a difference between the sample and anode voltages), while maintaining actual anode voltage so as to, on the one hand, meet a requirement for an accelerating voltage in the column and, on the other hand, prevent breakdown in the system operation. This is implemented by appropriately distributing the voltage supply between the electrodes of the column, namely, anode-electrode, the cap-electrode, and the sample under inspection, while supplying a certain negative voltage to the sample. The voltage supply distribution is adjusted in accordance with the desired accelerating voltage for primary and secondary beams, the desired primary beam energy landing; and a required operational mode of the column, namely, normal mode or tilt mode, HAR or non-HAR mode. For non-HAR mode, voltage supplied to the cap-electrode is either slightly lower or substantially equal to that of the sample. For HAR mode, voltage supplied to the cap-electrode is significantly higher as compared to that of the sample.

As also indicated above, when the entire magnetic circuit of a magnetic deflector is grounded, which is typically the case, an increase of the negative voltage supplied to the sample (in absolute value) is limited by the breakdown condition at a given working distance.

The present invention provides a novel configuration of the beam directing system including an electrostatic lens having an electrode (e.g., cap-electrode) typically formed with a beam opening for a charged particle beam passage therethrough, and a magnetic deflector having a magnetic circuit including a part thereof (core part) for carrying excitation coils and a polepieces part, wherein the polepieces part of the magnetic deflector is in electrical communication with the cap-electrode of the electrostatic lens and is electrically insulated from the other part of the magnetic circuit. The electrical communication between the cap-electrode and the polepieces of the magnetic deflector may be achieved by providing a very small gap between them (e.g., 0.1–0.2 mm) or by physical connection between them. The cap-electrode is made from a non-magnetic metal, such as aluminum, stainless steel, copper, etc. The polepieces of the deflector are made of a soft magnetic material (μ-metal), such as Conetic A—A having about 79% Ni, or Conetic B—B having about 45% Ni). An electrical insulator element (made of Capton) is located between each of the polepieces and the other part of the magnetic circuit.

The above configuration (electrical communication between the polepieces of the magnetic deflector and the cap-electrode and electrical insulation between the polepieces and the other part of the deflector's magnetic circuit) provides for operating with an increased effective voltage of the column, thus significantly reducing aberrations and improving the efficiency of detection and the image resolution, even for a low energy primary beam, i.e., beam energy of 500 eV and lower, for both normal incidence beam mode and large electron tilt mode, and for both HAR mode and "non-HAR" mode. The inventors have shown a 10–15% improvement of image resolution when operating with a primary beam energy landing of 500 eV. Additionally, using a very small gap or preferably absence of a gap between the cap and the polepieces provides for reducing the inner diameter of the polepieces, enabling beam deflection with decreased electric current through the coils of the magnetic deflector, and increasing the sensitivity of the deflector, i.e., increasing the beam deflection at a given electric current through the coils of the magnetic deflector.

Thus, according to one aspect of the present invention, there is provided a beam directing system for directing a charged particle beam towards and away from a sample, the system comprising: a lens arrangement having an electrode formed with a beam opening for a charged particle beam passage therethrough; and a magnetic deflector having a magnetic circuit formed by a core part for carrying excitation coils and a polepieces part; the polepieces of the magnetic deflector being in electrical communication with said electrode and being electrically insulated from the other part of the magnetic circuit.

According to another aspect of the invention, there is provided a beam directing system for directing a charged particle beam towards and away from a sample, the system comprising: a lens arrangement having an electrode formed with a beam opening for a charged particle beam passage therethrough; and a magnetic deflector formed by a magnetic circuit having a core part thereof for carrying excitation coils and a polepieces part, the polepieces of the magnetic deflector being in electrical communication with said electrode and being electrically insulated from the other part of the magnetic circuit, the system thereby providing for at least one of the following: decreasing an inner diameter of the polepieces, operating with an increased absolute value of a negative voltage supply to the sample up to (−10) kV, and increasing sensitivity of the magnetic deflector by providing a higher beam deflection at a given electric current through the coils of the magnetic deflector.

According to yet another aspect of the invention, there is provided a charged particle beam column for inspecting a sample, the column comprising: an electrostatic lens formed by an anode-electrode and an electrode located downstream of the anode-electrode with respect to a beam propagation towards the sample; and a magnetic deflector having a magnetic circuit formed by a core part for carrying excitation coils and polepieces part, which is mounted so as to be in electrical communication with said electrode of the electrostatic lens; and an insulating assembly located so as to electrically insulate the polepieces from the other part of the magnetic circuit.

According to yet another aspect of the invention, there is provided a charged particle beam column for inspecting a sample, the column comprising a beam directing system for directing a charged particle beam towards and away from the sample, the beam directing system comprising: an electrostatic lens having an electrode formed with a beam opening for a charged particle beam passage therethrough; and a magnetic deflector formed by a magnetic circuit having a core part thereof for carrying excitation coils and a polepieces part, the polepieces of the magnetic deflector being in electrical communication with said electrode of the electrostatic lens and being electrically insulated from the other part of the magnetic circuit, the column operation thereby providing for at least one of the following effects: operating with an increased absolute value of a negative voltage supply to the sample under inspection, to thereby improve image resolution of the column, decreasing an inner diameter of the polepieces, and increasing sensitivity of the magnetic deflector by providing a higher deflection of the beam propagation axis from an optical axis of the system at a given electric current through the coils of the magnetic deflector.

According to yet another aspect of the invention, there is provided a method for use in controlling a charged particle beam propagation in a charged particle beam column, the method comprising: providing an electrical communication between a polepieces part of a magnetic circuit of a magnetic deflector and an electrode of a lens arrangement, and electrically insulating said polepieces part from other part of said magnetic circuit.

The method provides for at least one of the following effects: increasing an absolute value of a negative voltage supplied to the sample and thereby increasing effective voltage of the column at a desirably low working distance, decreasing an inner diameter of the polepieces, and increasing sensitivity of the magnetic deflector by providing a higher beam deflection at a given electric current through coils of the magnetic deflector.

Additionally, the present invention provides for a novel configuration of a gas supply unit. The gas supply unit is associated with said electrode (cap-electrode) of the electrostatic lens, namely, is rigidly connected (made integral) with the cap-electrode. The cap-electrode, in addition to the central beam opening) is formed, at its periphery region (side surface), with a gas opening for gas flowing from the outer side surface of the cap towards the central beam opening. Preferably, the arrangement is such that this gas opening is vertically aligned with a gap between two locally adjacent polepieces of the deflector.

Thus, according to yet another aspect of the invention, there is provided a method for use in a charged particle beam column for supplying gas into a vicinity of a sample under inspection, the method comprising rigidly connecting elements of a gas supply unit to an electrode of the charged particle beam column which is located closer to the sample;

and configuring said electrode to define at least one inner gas channel from the gas supply unit towards a beam opening made in said electrode.

According to yet another aspect of the invention, there is provided an electrode assembly for use in a charged particle beam column for controlling an electric field in the vicinity of a sample, said electrode assembly comprising at least one first, central beam opening for a charged particle beam passage therethrough, a second opening made in periphery region of said electrode assembly for rigidly connecting to a gas nozzle of a gas supply unit, and one or more internal channel extending between said second opening and said at least one first opening for allowing gas flow from the gas nozzle to said at least one first opening.

The electrode may be a single-part or two-part assembly. In the two-part configuration, the two parts have coaxially aligned first openings, are sealed to each other at their peripheral regions, and are spaced-apart from each other within their central regions thereby defining an inner cavity for the gas flow therethrough from said side opening towards the beam openings.

According to yet another aspect of the invention, there is provided a beam directing system for directing a charged particle beam towards and away from a sample, the system comprising a magnetic deflector having a core assembly and polepieces; and a lens arrangement for controlling an electric field in the vicinity of the sample, the lens arrangement comprising an electrode having at least one first central beam opening for a charged particle beam passage therethrough, and a second opening made in a periphery region of said electrode for connecting to a nozzle tube of a gas supply unit, said second opening being vertically aligned with a gap between said polepieces.

The charged particle beam may be an electron beam or a focused ion beam (FIB). The present invention may be used in an SEM or the like tool applied to a specimen, e.g., a semiconductor wafer, a mask, a reticle and the like, for imaging, measurements, metrology, inspection, defect review or the like purposes. For example, the present invention may be used for CD measurements, line profile measurements, copper-interconnects inspection/measurements typically performed after a photolithography process, automatic defect classification, etc.

More specifically, the present invention is used with an SEM system for inspecting wafers, masks or reticles, and is therefore described below with respect to this application.

BRIEF DESCRIPTION OF THE DRAWINGS

In order to understand the invention and to see how it may be carried out in practice, preferred embodiments will now be described, by way of non-limiting examples only, with reference to the accompanying drawings, in which:

FIGS. 2A–2D more specifically illustrate a configuration of the beam directing system of FIG. 1, wherein

DETAILED DESCRIPTION OF THE INVENTION

Figure 1:
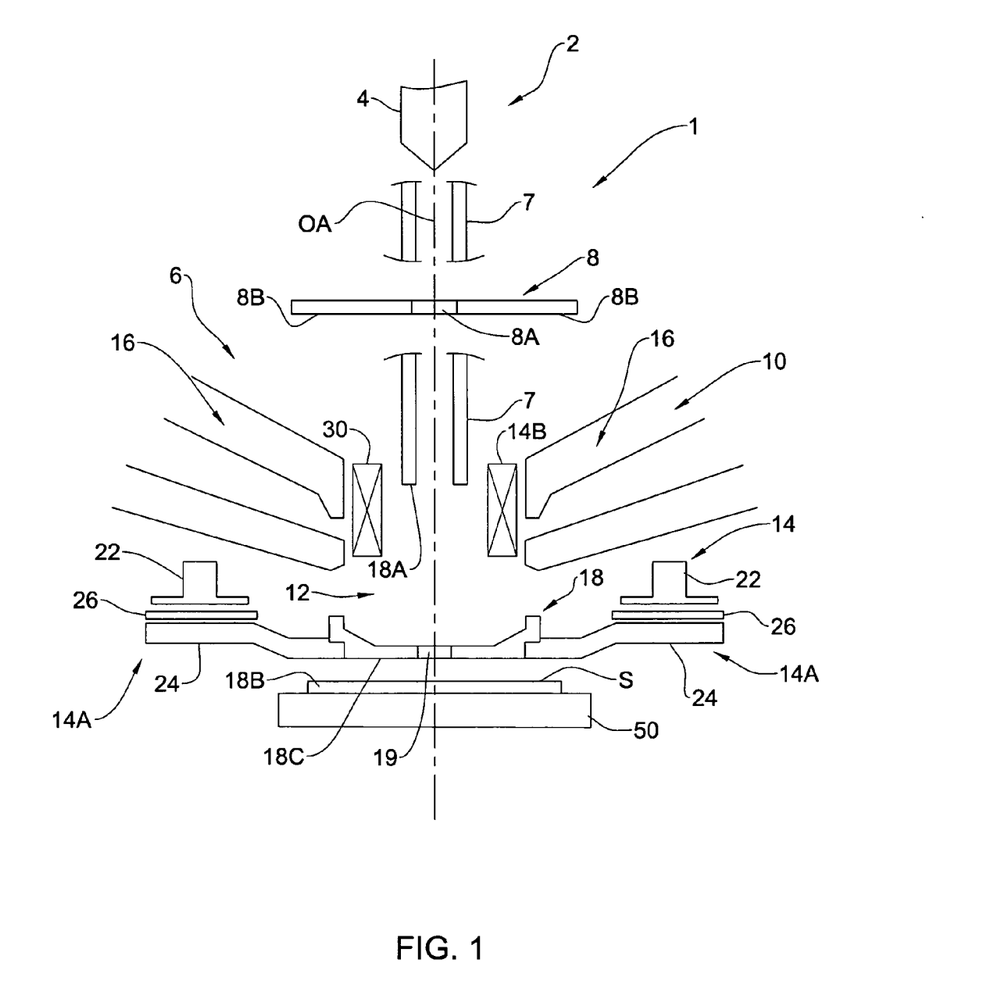
FIG. 1 schematically illustrates a SEM system utilizing a beam directing system of the present invention.

Referring to FIG. 1, there is schematically illustrated an SEM 1 for measuring a sample S (e.g., a semiconductor wafer, a mark, a reticle and the like), which is located on a sample holder 50. The SEM 1 typically includes an electron beam source 2 (a so-called "electron gun") having a small tip (cathode) 4; a charged particle beam column 6; and a secondary electrons' detector 8. The charged particle beam column 6 includes an anode tube 7 that defines a primary beam drift space; and a beam directing system 10 of the present invention configured for focusing and deflecting a primary beam propagating towards the sample and collecting a secondary beam from the sample. The longitudinal axis of the anode tube 7 defines an axis OA of the primary beam propagation towards the arrangement 10.

In the present example, the detector 8 is the so-called "in-column" or "in-lens" detector, designed like a plate having an opening 8A surrounded by detecting regions 8B. The detector 8 is located such that the longitudinal axis of the anode tube 7 passes the opening 8A, which thus serves as a primary beam hole. The column 6 also typically comprises beam blank means, condenser arrangement, several apertures (including a final aperture defining the primary beam diameter, and alignment coils), and a stigmator arrangement, which are not shown here.

The beam directing system 10 is configured according to the invention to improve the image resolution obtainable with the SEM 1. The beam directing system 10 includes a lens arrangement 12 having an electrode 18C formed with a beam opening 19 for a charged particle beam passage therethrough; and a magnetic deflector 14A having a magnetic circuit 22 formed by a core part 23 for carrying excitation coils (not shown) and a polepieces part 24. The polepieces 24 are in electrical communication with the electrode 18C and are electrically insulated from the other part of the magnetic deflector.

The lens arrangement 12 includes a magnetic objective lens 16 and an electrostatic lens 18. The objective lens 16 is formed by excitation coils and two polepieces. The electrostatic lens 18 is formed by an electrode 18A constituted by the lower end of the anode tube 7, and the electrode 18C (cap-electrode) located between the anode and the sample and serving for regulating an electric field created in the vicinity of the sample. The sample S actually serves as the third electrode 18B of the electrostatic lens 18. As indicated above, the cap-electrode 18C is formed with the central opening 19 for the charged particle beam passage therethrough (primary and secondary beams). The system 10 may also include another deflector 14B located upstream of the magnetic deflector 14A with respect to the direction of propagation of a primary beam towards the sample (the so-called double-deflection assembly). As indicated above, according to the invention the polepieces 24 are in electrical communication with the cap-electrode 18C and are electrically insulated from the other part 23 of the magnetic circuit 22 by an insulator assembly 26, for example, in the form of insulating rings between each polepiece 24 and the core 23.

The polepieces 24 are made of a soft magnetic material (μ-metal), such as Conetic A—A having about 79% Ni, or Conetic B—B having about 45% Ni). The cap-electrode is made of non-magnetic metal, such as aluminum, stainless steel, copper, etc.

In the present example, the electrical communication between the cap-electrode 18C and the polepieces 24 of the magnetic deflector is achieved by physical connection between them. To this end, the cap-electrode 18C may be fixed on the polepieces 24 by welding, gluing or mechanical clamping mechanism. It should, however, be noted that the desired electrical communication between the cap-electrode and the polepieces may be achieved by accommodating them with a very small gap between them, e.g., about 0.1–0.2 mm. The electrical communication between the cap-electrode and the polepieces of the magnetic deflector is such as avoid a floating voltage on the cap-electrode. A minimal acceptable gap between the cap-electrode and the polepieces of the magnetic deflector is limited by non-homogeneity of the electrical field in the vicinity of the sample.

The above configuration (polepieces of the magnetic deflector electrically connected to the cap-electrode and insulted from the other part of the deflector's magnetic circuit) provides for a high and equal voltage connection both to the cap-electrode and to the polepieces. Using a very small gap or preferably absence of a gap between the cap-electrode and the polepieces provides for reducing an inner diameter d (see FIG. 1) of the polepieces 24 (e.g., from 14 mm of the conventional configuration to 10–12 mm in the system of the present invention). Additionally, this configuration provides for decreasing an electric current required for beam deflection (e.g., from 0.65–0.7 A required in the conventional configuration to 0.4 A in the system of the present invention), and accordingly provides for significantly decreasing the power value, thus reducing heating and temperature drift effects. Operation with the reduced electrical current through the coils of the deflector actually provides for increasing the sensitivity of the deflector, i.e., at a given current through the deflector's coils, a higher deflection is obtained, e.g., at 1 A electric current through the coils, a 10 mm beam deflection is obtained, compared to the conventionally obtainable 6 mm beam deflection (a distance between the deflected beam propagation axis and the optical axis of the system).

Figure 2A:
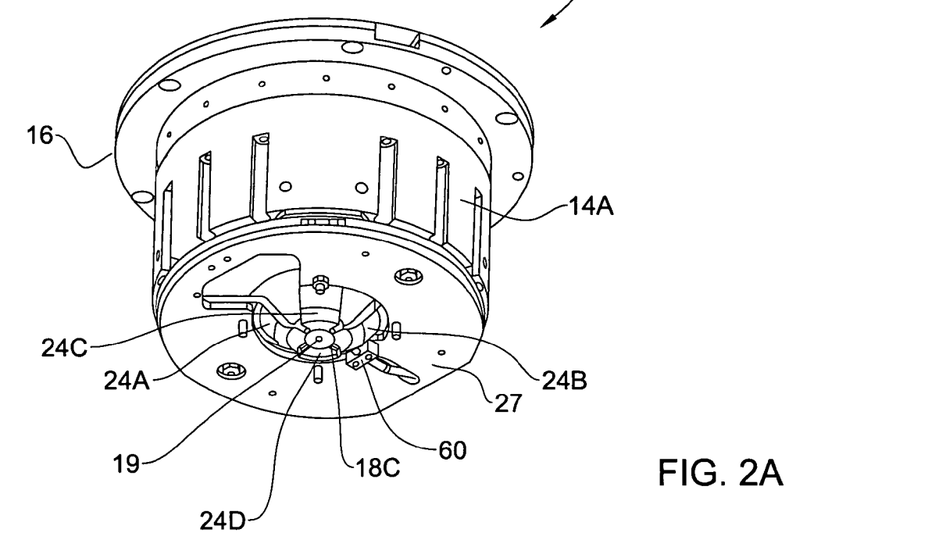
FIG. 2A shows the entire beam directing module.

Reference is made to FIGS. 2A–2D more specifically illustrating the configuration of the beam directing system 10. FIG. 2A shows the entire system (module) 10. The latter includes the objective lens 16, the magnetic tilt deflector 14A (called "electronic tilt module"), and the cap-electrode 18C formed with the beam opening 19. The magnetic deflector 14A includes a magnetic circuit having a cores' part (denoted 23 in FIG. 2D) and two pairs of polepieces 24A–24B and 24C–24D. The polepieces are in electrical communication with the cap-electrode 18C (in the present example, via physical connection between them) and are insulated from the other part 23 of the magnetic circuit by the insulating ring (26 in FIG. 2D). In the present example, the polepieces are mounted on a polepiece support (disk) 27 made of a non-magnetic material, e.g., aluminum. Also shown in FIG. 2A is a gas system 60, the configuration and operation of which will be described more specifically further below.

Figure 2B:
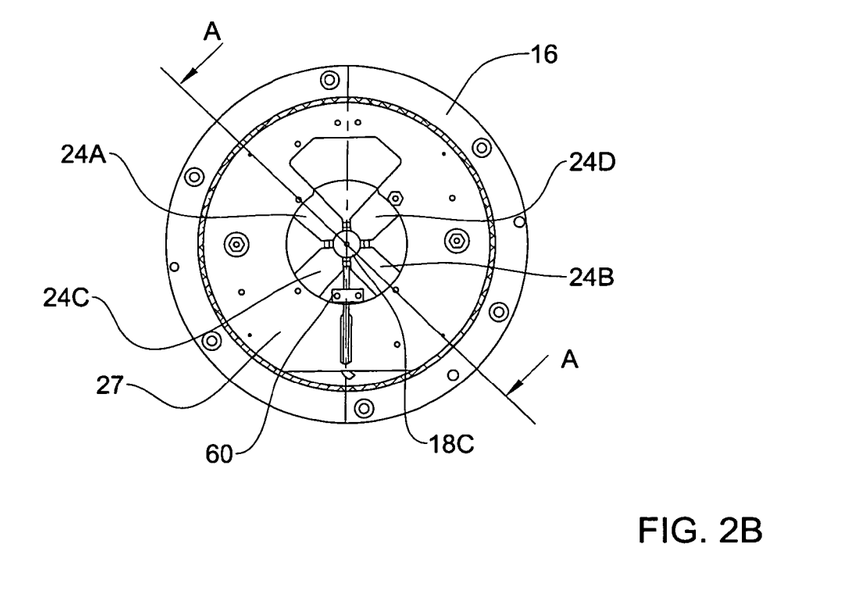
FIG. 2B shows a top view of the module of FIG. 2A.

FIG. 2B shows a top view of the module 10 illustrating more specifically a cap-polepiece assembly formed by the polepieces 24A–24D electrically connected to the cap-electrode 18C.

Figure 2C:
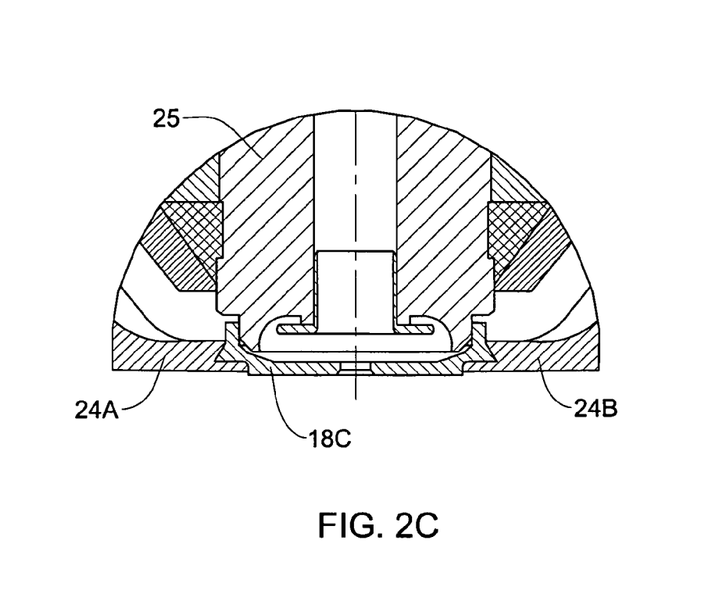
FIG. 2C shows a lower part of cross-section A—A of FIG. 2B.

FIG. 2C shows the lower part of the cross-section A—A of FIG. 2B. The cap-electrode 18C is connected to the polepieces (polepieces 24A and 24B being seen in the figure) by a mechanical clamping mechanism. The cap-electrode 18C has the outside conical surface and the polepieces have the inside conical surface. The cap and an objective funnel 25 have a contact area on the inside cap surface (outside the funnel surface). It should be noted that the arrangement is preferably such as to maximize the coaxiallity between the cap-electrode 18C and the objective lens, in order to reduce aberrations.

Figure 2D:
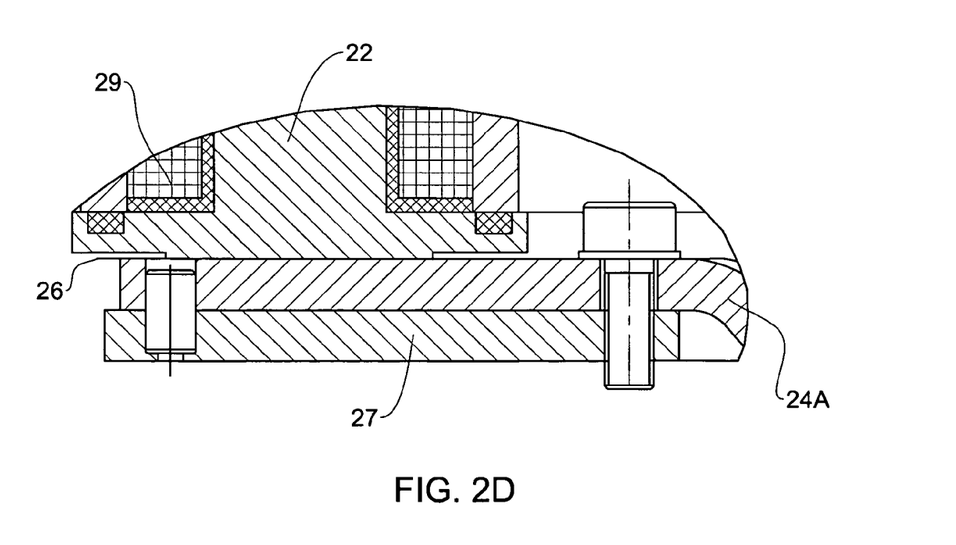
FIG. 2D shows more specifically a contact area between the polepieces part and the other part of the magnetic circuit of a magnetic deflector.

FIG. 2D shows more specifically the contact area between the polepieces and the other part of the magnetic circuit (cores) in the electronic tilt module (magnetic deflector), as well as the lower part of the cross section A—A of FIG. 2B. The polepiece disk 27 and polepieces (polepiece 24A being seen in the figure) are assembled together by a screw and centering pin. The insulator ring 26 is mounted between the polepiece 24A and the core 22. The latter carries a coil 29 that performs a high voltage connection to both the cap-electrode and the polepiece.

The present invention, provides for increasing the effective voltage of the column, and therefore improving the image resolution, while not increasing the actual anode voltage, which is, on the one hand, limited by the possibility of breakdown and, on the other hand, by the required accelerating voltage. As indicated above, the "effective voltage of the column is defined by voltages of the anode and the sample. Typically, this is the absolute value of a difference between the sample and anode voltages. Thus, the present invention provides the increase in the effective voltage at a given anode voltage. Another important parameter of the column operation is a primary beam energy landing. This energy is defined by a potential difference between the cathode and the sample. It is known that, on the one hand, operation with a lower beam landing energy is preferred in order to prevent damaging of the sample, while, on the other hand, a sufficient image resolution is typically obtainable with a higher beam energy landing. The present invention, due to the increased effective voltage, provides for high-resolution imaging with a relatively low primary beam energy landing (E=500 eV and lower, e.g., E=100 eV). As known, image resolution of an SEM is limited mainly by chromatic aberrations. The present invention provides for operating with the effective voltage of 15 kV ($V_{anode}$=8 kV, $V_{sample}$=(−7) kV, $V_{cathode}$=(−7.5) kV, E=500 eV), in which case the coefficient of chromatic aberrations is CA=0.2 (calculated using the MUNRO software), and accordingly the image resolution is increased up to 14–15%, comparing to that obtainable with the conventional configuration.

During the system operation, the core part 23 of the magnetic circuit 22 of the magnetic deflector 14A is grounded. The electrical communication between the polepieces 24 of this deflector and the cap-electrode 18C and electrical insulation between the polepieces and the other part (core) of the magnetic circuit provides for supplying a certain relatively high negative voltage (from −3 kV to −10 kV) to the sample. The cap-electrode and anode-electrode voltages (as well as that of the cathode electrode) are such as to provide a desired accelerating voltage that is kept during the system operation, a desired electric field in the vicinity of the sample (HAR mode or non-HAR-mode), and a desired effective voltage of the column. For example, at a working distance of 0.8 mm, anode voltage $V_{anode}=(+9.5)$ kV, and primary beam energy landing of 500 eV, the voltages supplied to the sample and cap are as follows: for non-HAR mode $V_{sample}=(-3)$ kV, $V_{cap}=(-3.3)$ kV, and for HAR mode $V_{sample}=(-5)$ kV, $V_{cap}=(-2)$ kV. In this specific example, the effective voltage of the column is 12.5 kV for non-HAR mode and 14.5 kV for HAR mode. It should be understood that in order to achieve the desired acceleration of the charged particles beam (accelerating voltage), the cathode voltage is adjusted to provide appropriate potential difference between the cathode and anode.

Figure 3:
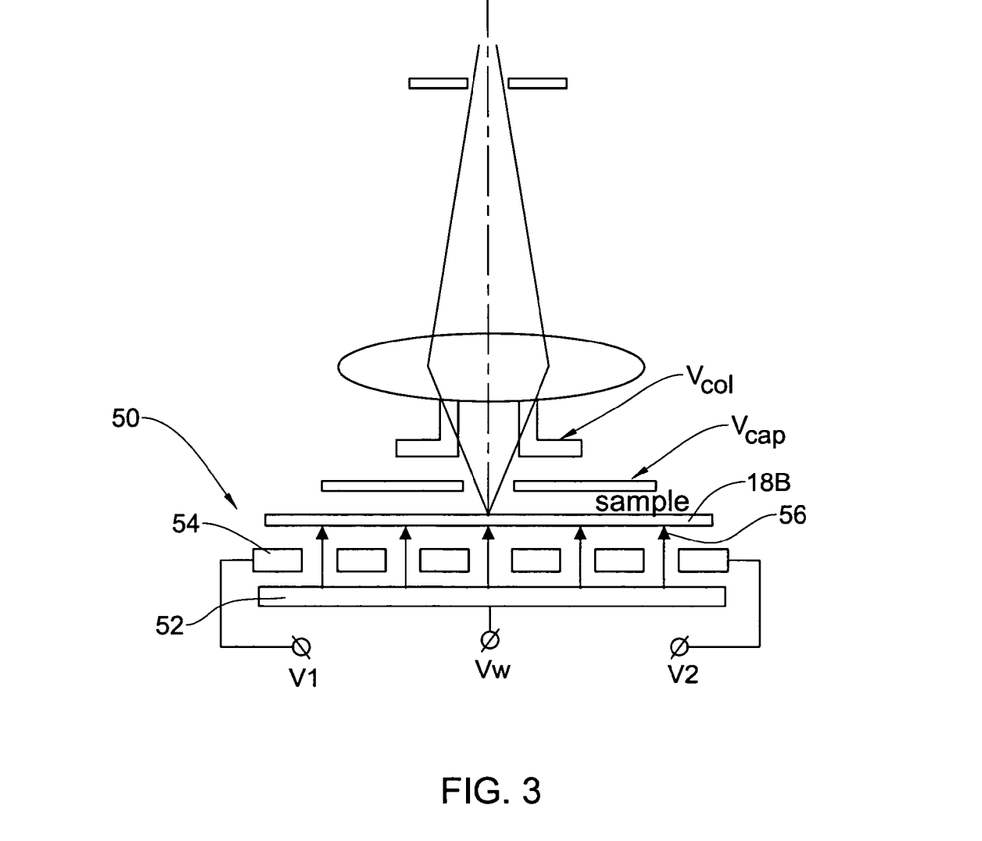
FIG. 3 shows a sample holder configured for holding a sample by electrostatic forced and supplying a required voltage to the sample.

The voltage supply to the sample is preferably implemented via a sample holder system. Referring to FIG. 3, there is shown a sample holder (chuck) 50 configured for holding a sample by electrostatic forces. On the one hand, a voltage supply to the electrodes of the sample holder 50 is such as to provide the electrostatic forces that flatten the sample on the holder as much as possible, to thereby minimize a working distance (a distance between the cap-electrode and the sample's plane). On the other hand, the voltage supply to the chuck electrodes should be such as to provide a desired negative voltage to the sample. The chuck 50 includes a lower electrode 52 formed with an array of spaced-apart projecting elements (pins) 56 holding the sample on their distal portions, and an upper electrode 54 in the form of an array of electrode elements allowing the pins passage through the spaces between the electrode elements. A voltage supplied to the lower electrode 52 defines the sample-electrode voltage, and a potential difference applied to the upper electrode elements flattens the sample. The chuck electrodes give a base potential of the sample $V_{sample}=V_{52}$ and two potentials $V_1=V_{52}+\Delta V$ and $V_2=V_{base}-\Delta V$ (e.g., $\Delta 700V$).

The present invention also provides for a novel gas supply unit. As indicated above, the need for a gas supply to a region of the column between the cap electrode and the sample can be associated with a requirement for appropriately discharging the sample. According to the invention, the gas supply unit is integral with the cap electrode.

Figure 4A:
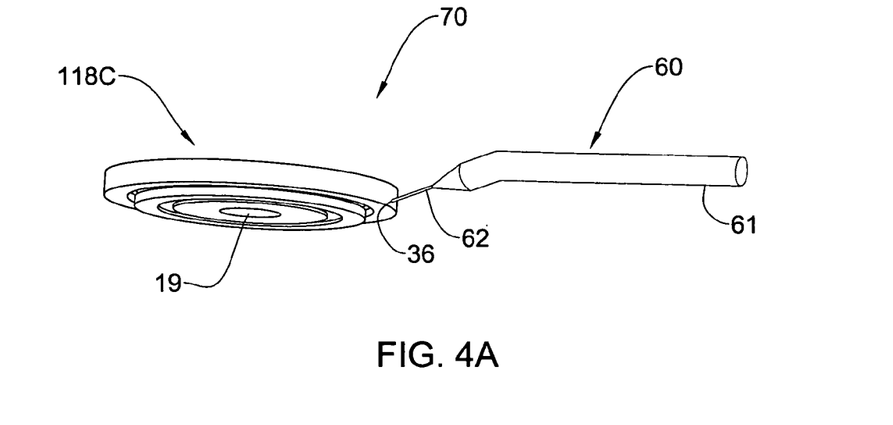
FIG. 4A illustrates a gas supply system of the present invention formed by a gas supply unit associated with the cap-electrode of an electrostatic lens.

FIG. 4A schematically illustrates an assembly, generally designated 70, formed by a gas supply unit 60 rigidly connected to a cap-electrode assembly 18C via an opening 36 made in an outer side surface of the cap-electrode. The gas supply unit includes a gas tube 61 (such as a plastic tube) and a nozzle 62, which is by its one end connected to the gas tube 61 and by its other end is mounted in the opening 36.

Thus, the elements of the gas supply unit are rigidly connected to each other and to the cap. When the cap is to be removed from the lens arrangement (e.g., for cleaning purposes), the entire gas supply unit is removed, avoiding movement of delicate elements of the gas supply unit with respect to each other and thus preventing breakage of a nozzle tube as well as maintaining the tightness of the connection within the unit.

Figure 4B:
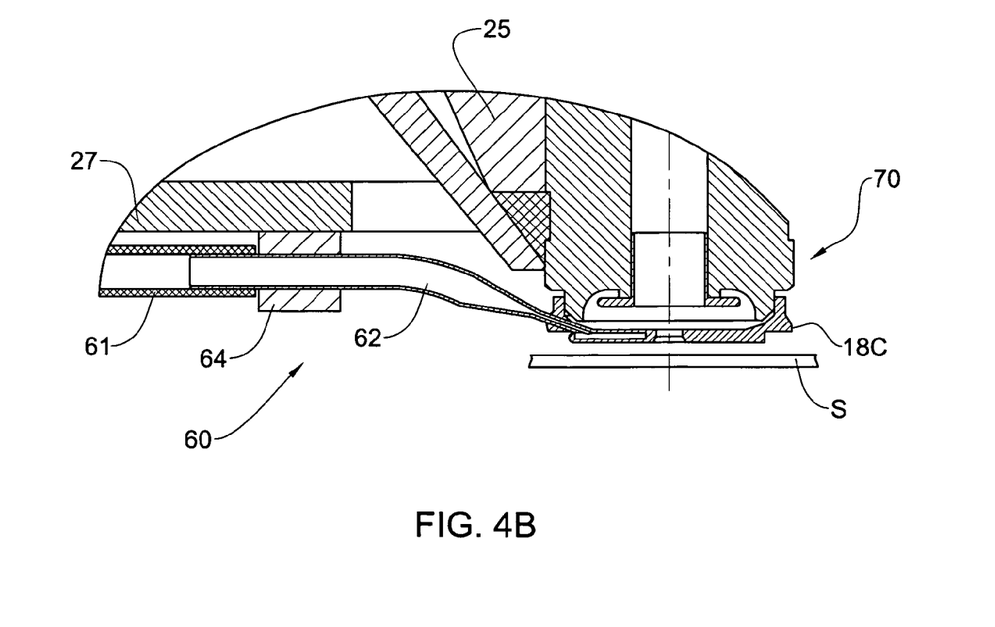
FIGS. 4B and 4C show more specifically the configuration of the system of FIG. 4A.
Figures 4C, 4D:
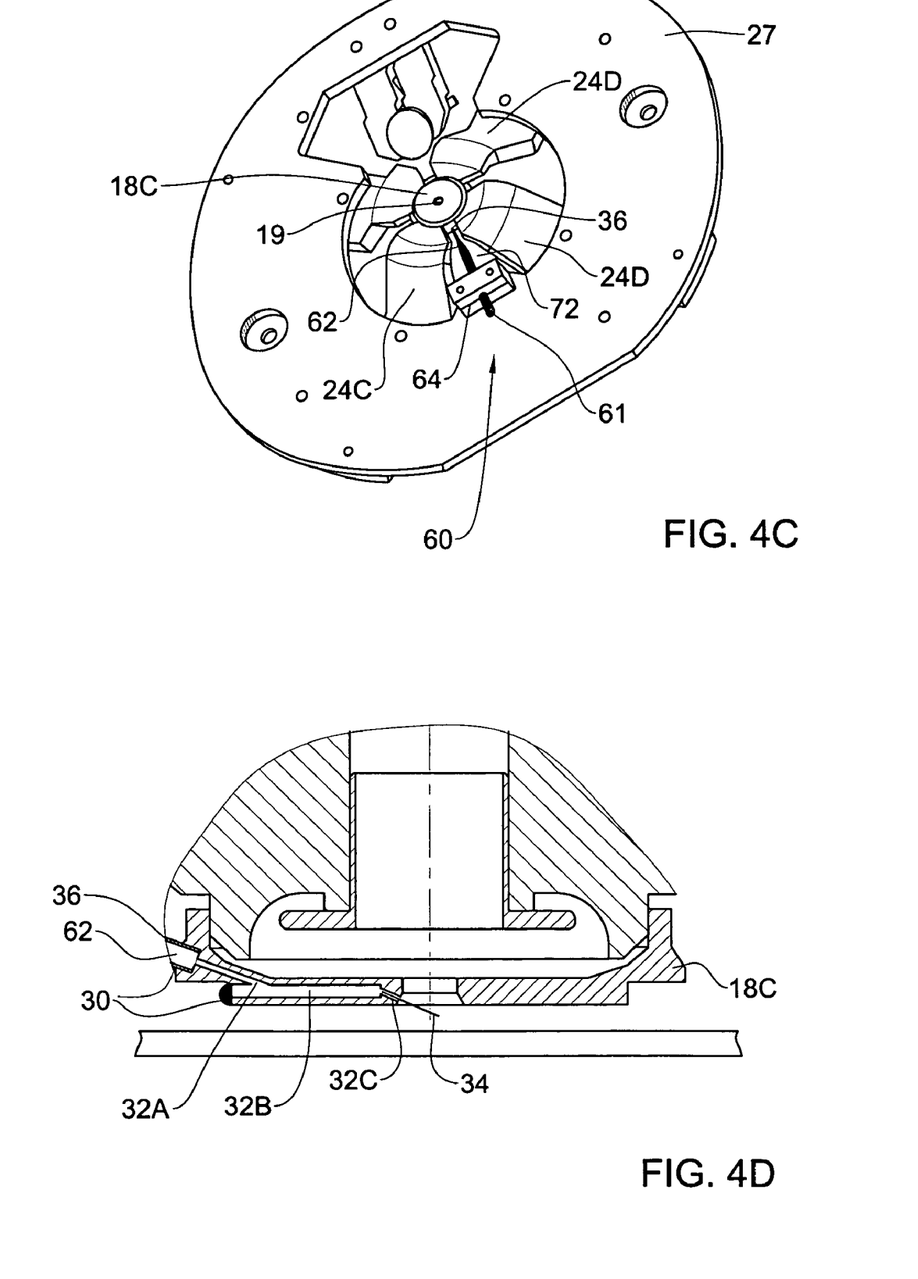
FIG. 4D shows one example of the cap-electrode assembly, configured as a single-part assembly.

FIGS. 4B and 4C show more specifically the main elements of assembly 70 formed by the gas supply unit 60 and the cap-electrode 18C. The gas supply unit 60 includes the gas tube 61 (e.g., plastic tube), the nozzle 62, and a holder 64. The holder 64 with nozzle 62 is mounted on a support element which may be constituted by the polepiece support (disk) 27. It should be noted that the gas supply unit may be used with the conventional beam directing assembly, namely, where a cap-electrode is electrically disconnected from the polepieces of a magnetic deflector. The cap-electrode may thus be supported by any non-magnetic support element (e.g., made of stainless steel or aluminum).

The nozzle 62 is at its one end connected to the gas tube 61, that supplies gas to the cap-electrode 18C. Connection between the nozzle 62 and the cap-electrode 18C is carried out by welding, gluing or soldering, generally at 30. The cap-electrode 18C at its outer side surface is formed with the opening 36 (capillary nozzle hole) for mounting the nozzle 62 and thus allowing for gas flowing from the outer side surface of the cap towards the central opening 19 thereof. The nozzle tube 62 has a thinner diameter at its one end, and is mounted such that this thinner portion of the tube inserts the inlet opening 36 in the cap. The opposite end of the nozzle tube is connected, via the gas tube 61, to a gas dosage supply system (not shown). A contact zone between the nozzle tube and the cap-electrode is sealed. As exemplified in FIG. 4C, the configuration is such that the opening 36 (i.e., and accordingly the gas supply unit 60) is located within a gap 72 between the polepieces of the magnetic deflector. The cap-electrode 18C is configured to define one or more gas channels allowing the gas flow from the opening 36 to the beam opening 19 in the cap-electrode. The cap-electrode may have a single-part or two-part configuration.

Figure 5A:
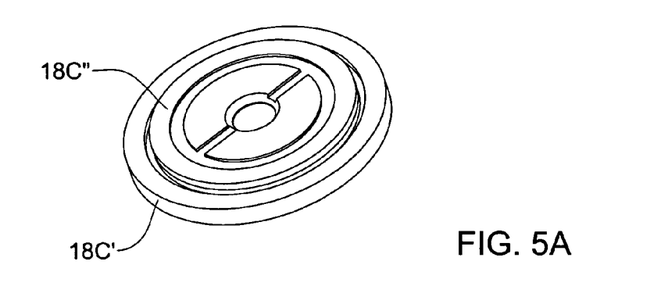
FIGS. 5A to 5C show another example of the cap-electrode assembly, configured as a two-part assembly.
Figure 5B:
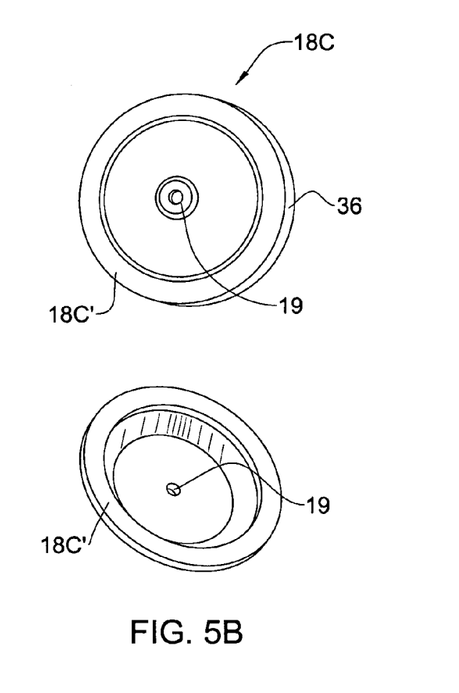
Figure 5C:
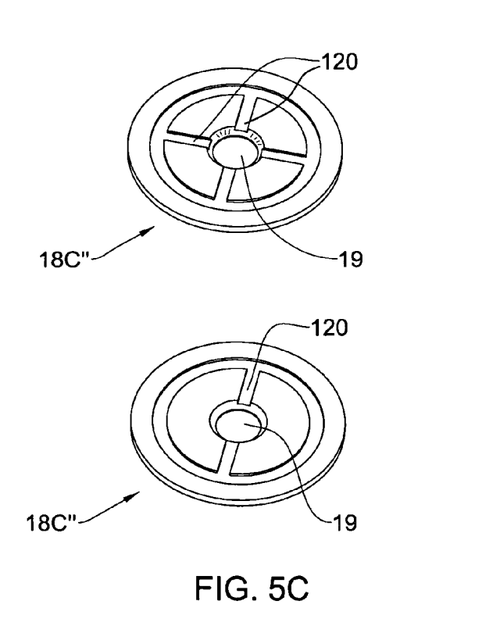

FIG. 4D shows more specifically an example of the single-part cap-electrode assembly 18C. The cap-electrode 18C has internal channels 32A, 32B and 32C. Channel 32A serves for connecting the inside of the nozzle 62 to the cap. Channel 32B connects channels 32A and 32C to each other. Channel 32C has a gas hole and guides the gas flow to a charged particle beam area, namely the central opening 19 in the cap-electrode. The channel 32B is at its one side closed by element 30 (welding, gluing or soldering). The configuration is such that a cross point 34 between the gas flow and the charged particle beam is located in an area between the sample S and the lower surface of the cap-electrode 18C. It should be noted, although not specifically shown here, that the cap-electrode may be formed with several equally spaced channels 32B, which provides uniform gas supply towards the beam opening in the cap-electrode. FIGS. 5A to 5C schematically illustrate a two-part cap-electrode assembly 18C. The gas supply unit 60 is connected to the cap-electrode 18C via an opening 36 made on the side surface of the cap-electrode. The cap-electrode 18C has a first part (cap base) 18C' by which the cap faces the sample's plane, and a second part (cap cover) 18C". Two examples of the implementation of the cap cover are shown in FIG. 5C, differing from each other in the configuration of internal gas flow channels. Both parts 18C' and 18C" are made with central openings 19, such that when the two parts are assembled together (FIG. 5A) the openings are coaxially arranged. The peripheral regions of cap parts 18C' and 18C" are in sealed contact to each other. An inner cavity (defined by a space between these parts in the central regions thereof) provides the gas passage towards and away from the central openings, the gas being inlet through the opening 36 made in the side surface of one of these parts (cap base part 18C' in the present example). At least one of the two cap parts (cap cover part 18C" in the present example) has an arrangement of inner gas flow channels 120 including a circular channel and two or more radial channels that divide the inner cavity into segments allowing the gas passage by jets into the zone of the beam opening 19 in the cap.

Those skilled in the art will readily appreciate that various modifications and changes can be applied to the embodiments of the invention as hereinbefore described without departing from its scope as defined in and by the appended claims.

The invention claimed is:

1. A beam directing system for directing a charged particle beam towards and away from a sample, the system comprising: a lens arrangement having an electrode formed with a beam opening for a charged particle beam passage therethrough; and a magnetic deflector having a magnetic circuit formed by a core part for carrying excitation coils and a polepieces part; the polepieces of the magnetic deflector being in electrical communication with said electrode and being electrically insulated from the core part of the magnetic circuit.

2. The system of claim 1, wherein said polepieces of the magnetic deflector are spaced from said electrode a distance of about 0.1–0.2 mm, thereby providing said electrical communication between them.

3. The system of claim 1, wherein said polepieces of the magnetic deflector are physically connected to said electrode, thereby providing said electrical communication between them.

4. The system of claim 1, comprising an electrical insulator assembly accommodated between the polepieces part and the core part of the magnetic circuit.

5. The system of claim 1, operable with an increased in absolute value negative voltage supply to the sample, up to (−10) kV.

6. The system of claim 1, wherein an inner diameter of the polepieces is of about 10–12 mm.

7. The system of claim 1, operable with en electric current of about 0.4 A through the coils of the magnetic deflector to implement deflection of the charged particle beam.

8. The system of claim 1, operable to implement a 10 mm deflection of the charged particle beam propagation axis from an optical axis of the lens arrangement at a 1 A electric current through the coils of the magnetic deflector.

9. The system of claim 1, wherein the polepieces are made of a soft magnetic material, and said electrode is made of a non-magnetic metal.

10. The system of claim 1, comprising a gas supply unit for supplying gas into a region between said electrode and the sample, the gas supply unit being rigidly connected to a location on said electrode.

11. The system of claim 1, comprising a gas supply unit for supplying gas into a region between said electrode and the sample, the gas supply unit being configured to be integral with said electrode, thereby allowing for assembling and dissembling said electrode together with the gas supply unit.

12. The system of claim 10, wherein the gas supply unit comprises a nozzle tube, which is by its one end connected to an opening at said location in a side surface of said electrode, and by its other end is connectable to a gas supply system via a gas tube.

13. The system of claim 10, wherein said location on the electrode for connecting the gas supply unit is vertically aligned with a gap between the polepieces of the magnetic deflector.

14. The system of claim 12, wherein said electrode is formed with one or more inner channel configured so as to provide the gas passage from the nozzle tube to the beam opening in said electrode.

15. The system of claim 12, wherein said electrode is a two-part assembly including a base part and a cover part, each of said parts having the beam opening, such that when said parts of the electrode are assembled the beam openings are coaxially aligned, peripheral regions of said parts are sealed to each other, and central regions of said parts define an inner cavity between them.

16. The system of claim 15, wherein at least one of the base and cover parts has the opening in its side surface for connecting to the nozzle tube.

17. The system of claim 15, wherein at least one of the base and cover parts are patterned to define at least one said inner channel for the gas passage from the nozzle tube to the central openings in the electrode.

18. The system of claim 17, wherein the electrode includes at least two said inner channels configured so as to allow the gas flowing by jets towards the central opening.

19. The system of claim 12, wherein the elements of the gas supply unit are rigidly connected to each other and to said electrode.

20. A beam directing system for directing a charged particle beam towards and away from a sample, the system comprising: a lens arrangement having an electrode formed with a beam opening for a charged particle beam passage therethrough; and a magnetic deflector formed by a magnetic circuit having a core part thereof for carrying excitation coils and a polepieces part, the polepieces of the magnetic deflector being in electrical communication with said electrode and being electrically insulated from the core part of the magnetic circuit, the system thereby providing for at least one of the following: decreasing an inner diameter of the polepieces, operating with an increased absolute value of a negative voltage supply to the sample up to (−10) kV, and increasing sensitivity of the magnetic deflector by providing a higher beam deflection at a given electric current through the coils of the magnetic deflector.

21. A charged particle beam column for inspecting a sample, the column comprising: an electrostatic lens formed by an anode-electrode and an electrode located downstream of the anode-electrode with respect to a beam propagation towards the sample; and a magnetic deflector having a magnetic circuit formed by a core part for carrying excitation coils and polepieces part, which is mounted so as to be in electrical communication with said electrode of the electrostatic lens; and an insulating assembly located so as to electrically insulate the polepieces from the core part of the magnetic circuit.

22. A charged particle beam column for inspecting a sample, the column comprising a beam directing system for directing a charged particle beam towards and away from the sample, the beam directing system comprising: an electrostatic lens having an electrode formed with a beam opening for a charged particle beam passage therethrough; and a magnetic deflector formed by a magnetic circuit having a core part thereof for carrying excitation coils and a polepieces part, the polepieces of the magnetic deflector being in electrical communication with said electrode of the electrostatic lens and being electrically insulated from the core part of the magnetic circuit, the column operation thereby providing for at least one of the following effects: operating with an increased absolute value of a negative voltage supply to the sample under inspection, to thereby improve image resolution of the column, decreasing an inner diameter of the polepieces, and increasing sensitivity of the magnetic deflector by providing a higher deflection of the beam propagation axis from an optical axis of the system at a given electric current through the coils of the magnetic deflector.

23. A method for use in controlling charged particle beam propagation in a charged particle beam column, the method comprising: providing an electrical communication between a polepieces part of a magnetic circuit of a magnetic deflector and an electrode of a lens arrangement, and electrically insulating said polepieces part from a core part of said magnetic circuit.

24. The method of claim 23, providing for at least one of the following effects: increasing an absolute value of a negative voltage supplied to a sample and thereby increasing effective voltage of the column at a desirably low working distance, decreasing an inner diameter of the polepieces, and increasing sensitivity of the magnetic deflector by providing a higher beam deflection at a given electric current through coils of the magnetic deflector.

25. A method for use in a charged particle beam column for supplying gas into a vicinity of a sample under inspection, the method comprising rigidly connecting elements of a gas supply unit to an electrode of the charged particle beam column, which is located closer to the sample, said electrode being electrically connected to a polepiece of a magnetic deflector; and configuring said electrode to define at least one inner gas channel from the gas supply unit towards a beam opening made in said electrode.

26. An electrode assembly for use in a charged particle beam column for controlling an electric field in the vicinity of a sample, said electrode assembly being electrically connected to a polepiece of a magnetic deflector and comprising at least one first, central beam opening for a charged particle beam passage therethrough, a second opening made in a periphery region of said electrode assembly for rigidly connecting to a gas nozzle of a gas supply unit, and one or more internal channel extending between said second opening and said at least one first opening for allowing gas flow from the gas nozzle to said at least one first opening.

27. The electrode assembly of claim 26, configured as a two-part unit, each of the two parts being formed with the first beam opening, the two parts being mounted such that the first openings are coaxial, the two parts being sealed to each other at their peripheral regions, and being spaced-apart from each other within their central regions thereby defining an inner cavity for the gas flow therethrough from said second opening towards the first openings.

28. A beam directing system for directing a charged particle beam towards and away from a sample, the system comprising a magnetic deflector having a core assembly and polepieces electrically insulated from said core assembly; and a lens arrangement for controlling an electric field in the vicinity of the sample, the lens arrangement comprising an electrode having at least one first central beam opening for a charged particle beam passage therethrough, and a second opening made in a periphery region of said electrode for connecting to a nozzle tube of a gas supply unit, said second opening being vertically aligned with a gap between said polepieces.

* * * * *